United States Patent [19]
Agata

[11] Patent Number: 6,064,612
[45] Date of Patent: May 16, 2000

[54] METHOD AND CIRCUIT FOR HIGH SPEED DIFFERENTIAL DATA TRANSMISSION

[75] Inventor: Masashi Agata, Osaka, Japan

[73] Assignee: Matsushita Electric Industrial Co., Ltd., Osaka, Japan

[21] Appl. No.: 09/126,273

[22] Filed: Jul. 30, 1998

[30] Foreign Application Priority Data

Aug. 1, 1997 [JP] Japan .................................. 9-207695

[51] Int. Cl.[7] .................................................. G11C 7/02
[52] U.S. Cl. ...................... 365/207; 365/203; 365/230.03
[58] Field of Search .................................... 365/203, 207, 365/230.03

[56] References Cited

U.S. PATENT DOCUMENTS

| | | |
|---|---|---|
| 5,313,434 | 5/1994 | Abe . |
| 5,428,574 | 6/1995 | Kuo et al. . |
| 5,521,874 | 5/1996 | Sandhu ..................................... 365/207 |
| 5,546,346 | 8/1996 | Agata et al. . |
| 5,636,174 | 6/1997 | Rao ..................................... 365/230.03 |
| 5,903,502 | 5/1999 | Porter ....................................... 365/201 |

OTHER PUBLICATIONS

A. Takai, et al., "250byte/sec Synchronous DRAM Using a 3–Stage–Pipelined Architecture", 1993, Symposium on VLSI Circuits, pp. 59–60.
Y. Choi, et al., "16Mbiy Synchronous DRAM with 125 byte/sec Data Rate". 1993 Symposium on VLSI Circuits, pp. 65–66.

H. Yamauchi, et al., "A Circuit Technology for High–Speed Battery–Operated 16–Mb CMOS DRAM's." IEEE Journal of Solid–State Circuits, vol. 28, No. 11, pp. 1084–1091, Nov. 1993.

a, Fujiwara, et al., "A 200MHz 16Mbit Synchronous DRAM with Block Access Mode", 1994 Symposium on VLSI Circuits Digest of Technical Papers, pp. 79–80.

*Primary Examiner*—David Nelms
*Assistant Examiner*—Gene N. Auduong
*Attorney, Agent, or Firm*—McDermott, Will & Emery

[57] ABSTRACT

A data read amplifier for differential transmission of data from a pair of complementary signal lines (DQ line pair) to another pair of complementary signal lines (DB line pair) via still another pair of complementary signal lines (DBI line pair) is disposed. The data read amplifier is provided with a circuit for detecting a voltage swing of not less than a specified amount on the DQ line pair which have been equalized in voltage to a logic high level, a circuit for detecting the completion of voltage equalization of the DBI line pair to a logic low level, and a circuit for detecting the completion of voltage equalization of the DB line pair to a logic high level. A control RS flip-flop is disposed so that an equalization/sensing control signal (ESC) is changed to a logic high level by just applying a read enable signal (REN), the DBI and DB line pairs automatically start being equalized in voltage, the ESC signal thereafter returns to a logic low level to the arrival timing of data onto the DQ line pair and to the completion timing of the voltage equalization of the DBI and DB line pairs, and the sensing operation onto the DBI and DB line pairs automatically start.

14 Claims, 3 Drawing Sheets

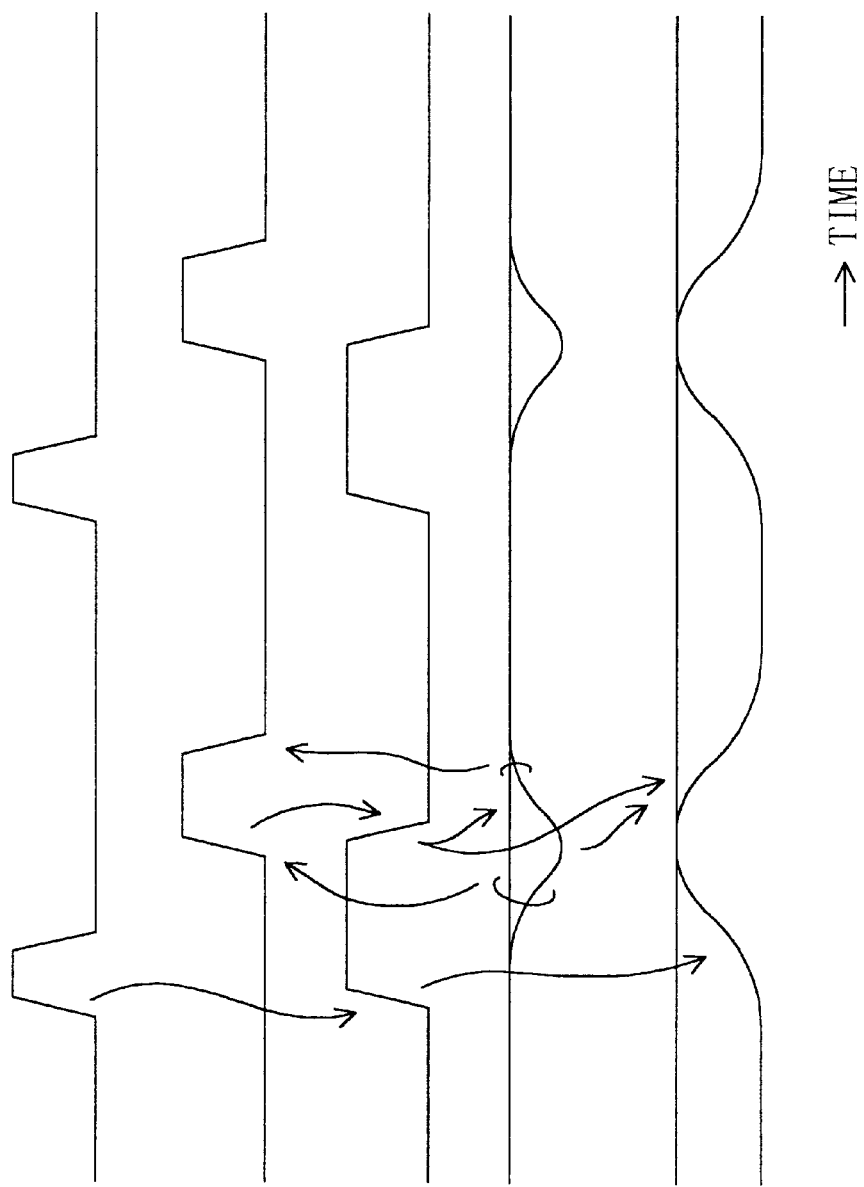

ND CIRCUIT FOR HIGH SPEED
METHOD AND CIRCUIT FOR HIGH SPEED DIFFERENTIAL DATA TRANSMISSION

BACKGROUND OF THE INVENTION

The present invention relates to the speed-up of differential data transmission in a semiconductor integrated circuit.

For the realization of high-speed semiconductor integrated circuits, demand for high-speed differential data transmission has been growing increasingly in recent years.

In a synchronous DRAM that is one of the MOS semiconductor memory devices, both a continuous data read operation in synchronization with an externally-applied clock signal and a continuous data write operation in synchronization with the clock signal are required. U.S. Pat. No. 5,546,346 discloses a fast, low-power differential transmission circuit for synchronous DRAMs. This differential transmission circuit is described. A data read amplifier for differentially amplifying data read onto a pair of complementary signal lines (DQ line pair) from a memory cell for forwarding onto another pair of complementally signal lines (DB line pair) is formed by N&PMOS cross-coupled amplifiers. Pipelining processing is employed in which one differential data transmission cycle comprises four periods. The first period is a stage for individually and simultaneously voltage-equalizing the DQ line pair and the DB line pair. The second period is a stage for receiving data onto the DQ line pair while continuously voltage-equalizing the DB line pair. The third period is a stage for establishing communication between the DQ line pair and the DB line pair for transmitting the data on the DQ line pair onto the DB line pair. The fourth period (i.e., the last period) is a stage for disconnecting the DQ-DB communication to voltage-equalize the DQ line pair while holding the data on the DB line pair.

The above-described differential transmission circuit is problematic in some case. If there occurs a shift from the second period to the third period when a voltage swing occurring on the DQ line pair is small therefore starting the sensing operation onto the DB line pair, this results in the occurrence of error data on the DB line pair due to the malfunction of the N&PMOS crossed-coupled amplifiers. In order to avoid such an unwanted event, the following is required. That is, a control clock signal for controlling the foregoing pipelining processing must be generated from a clock signal provided from outside the synchronous DRAM so that it is not until the moment there is produced a potential difference of not less than a certain amount between the DQ line pair (i.e., a target potential difference necessary for normal operations) that the sensing operation onto the DB line pair starts. The problem is that it is extremely difficult to control the timing of generation of a control clock signal so that the sensing operation onto the DB line pair timely starts when the potential difference between the DQ line pair reaches a target amount. When making an attempt that every operation is carried out normally, it is required to allow a time margin for generation of the control clock signal so that the control clock signal generation is somewhat delayed with respect to the lowest possible timing. This produces the problem that high-speed data transmission beyond a certain limit cannot be realized.

SUMMARY OF THE INVENTION

Accordingly, an object of the present invention is to realize a faster differential data transmission in a semiconductor integrated circuit such as a semiconductor memory device.

In order to achieve the foregoing object of the present invention, a means for detecting a voltage swing (amplitude) of not less than a specified amount on the DQ line pair is disposed. The data on the DQ line pair are transmitted onto the DB line pair in response to the detection of the voltage swing. This eliminates the necessity of the setting of a timing margin which has conventionally been required to make.

The above is described in detail. The present invention provides a differential data transmission method comprising a first step of equalizing voltages on a DQ line pair, a second step of interrupting the voltage equalization of the DQ line pair while starting equalizing voltages on a DB line pair, a third step of receiving data onto the DQ line pair while continuously voltage-equalizing the DB line pair, a fourth step of detecting a voltage swing of not less than a specified amount on the DQ line pair, and a last step of interrupting the voltage equalization of the DB line pair while establishing communication between the DQ line pair and the DB line pair in response to the detection of the voltage swing. For the realization of a differential data transmission in a self-completion manner, it is designed such that the voltage equalization of the DQ line pair resumes in response to the detection of the voltage swing on the DQ line pair.

It is to be noted that if the transmission of data from the DQ line pair onto the DB line pair starts before the DB line pair are not sufficiently equalized in voltage, this may result in the occurrence of error data on the DB line pair. In order to avoid the occurrence of such an unwanted event, a detection means is provided in the present invention for detecting the completion of the voltage equalization of the DB line pair. This makes it possible to start transmitting the data on the DQ line pair onto the DB line pair after the voltage swing on the DQ line pair is detected and the completion of the voltage equalization of the DB line pair is detected.

BRIEF DESCRIPTION OF THE DRAWINGS

FIG. 3, comprised of 3A–3E, is a signal waveform diagram showing the operation of the data read amplifier of FIG. 2.

DETAILED DESCRIPTION OF THE INVENTION

An embodiment of the present invention is described by reference to the accompanying drawings.

Figure 1:
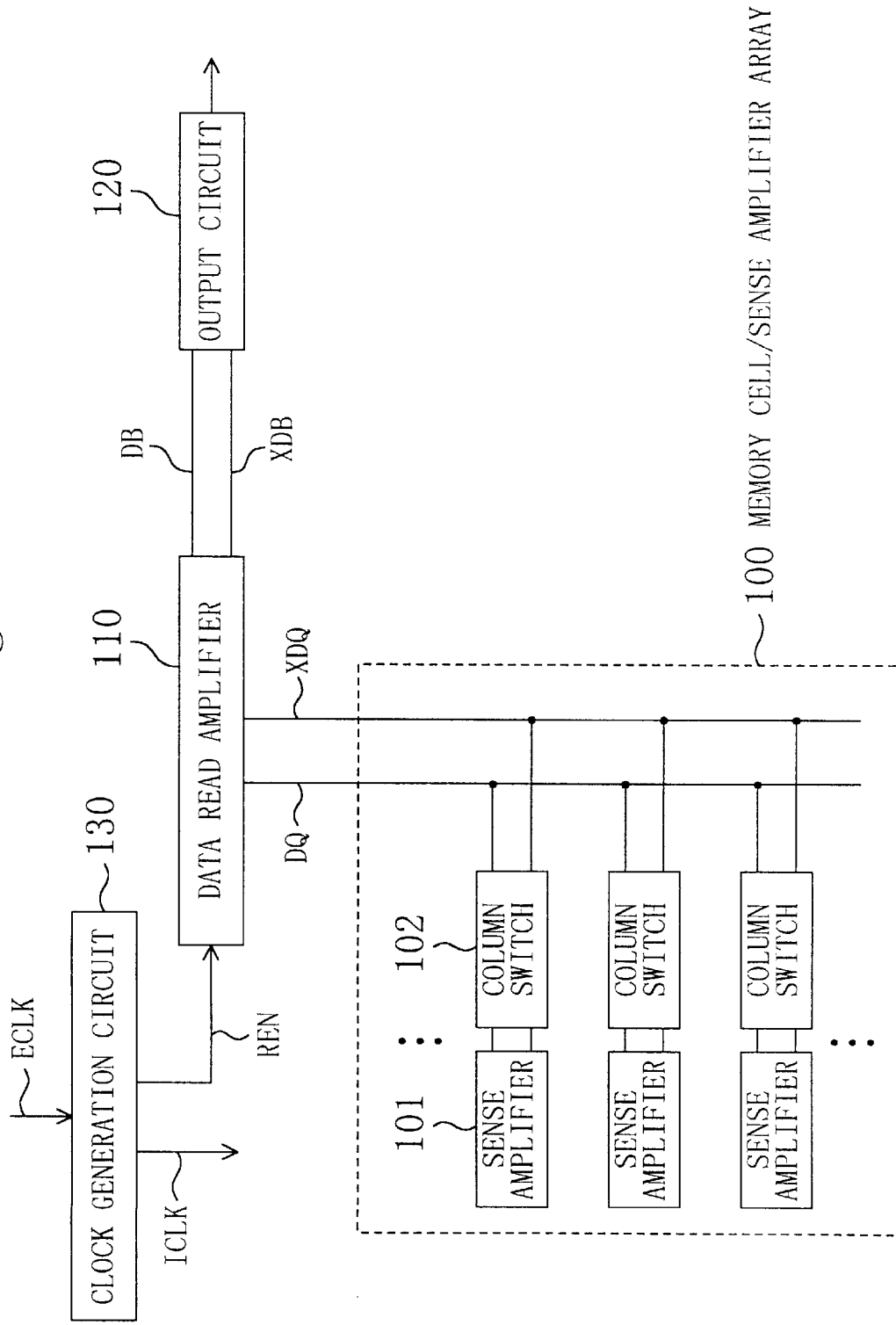
FIG. 1 is a block diagram showing an example of the structure of a semiconductor memory device according to the present invention.

FIG. 1 is a block diagram showing an example of the structure of a synchronous DRAM as a semiconductor memory device in accordance with the present invention. The synchronous DRAM of FIG. 1 has an array of memory cells/sense amplifiers 100 (hereinafter called the MC/SA array 100), a data read amplifier 110, an output circuit 120, and a clock generation circuit 130. In FIG. 1, no circuit components for the writing of data are shown.

The MC/SA array 100 has sense amplifiers 101 and column switches 102. Each of the sense amplifiers 101 contains therein a latch circuit connected to the memory cell array not shown in the figure. The latch circuit has two internal nodes from which a pair of bit lines extend. The bit line pair are connected, via one of the column switches 102, to a pair of complementary signal lines DQ/XDQ (hereinafter called the DQ line pair). In other words, the MC/SA array 100 is constructed such that read data is obtained from a target memory cell by the reading of data from the latch circuit of the sense amplifier 101 through the bit line pair and the DQ line pair.

The DQ line pair, extended from the MC/SA array 100, are connected to the data read amplifier 110. The output from the data read amplifier 110 is transmitted, over a pair of complementary signal lines DB/XDB (hereinafter called the DB line pair), to the output circuit 120 and provided from the output circuit 120 to the outside.

The clock generation circuit 130 receives an external clock signal ECLK for synchronous operation and generates internal clock signals ICLK for forwarding to plural in-memory circuit blocks. In the following description, the ICLK signal that is applied from the clock generation circuit 130 to the data read amplifier 110 is referred to as a read enable signal (an REN signal).

Figure 2:
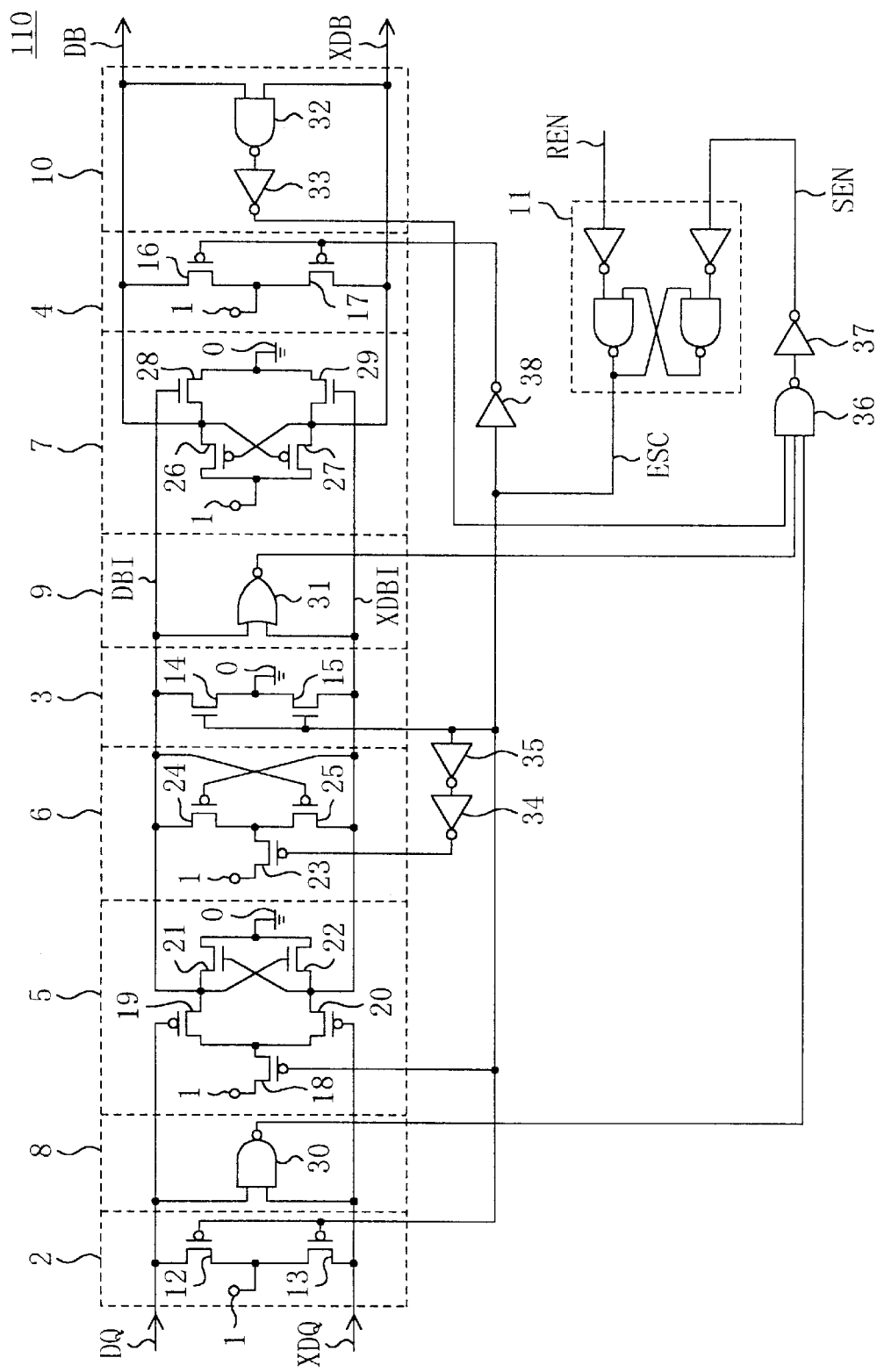
FIG. 2 is a circuit diagram showing the internal structure of a data read amplifier of FIG. 1.

Referring to FIG. 2, a differential transmission circuit forming the data read amplifier 110 of FIG. 1 is shown. The differential transmission circuit comprises the following components: a pair of complementary signal lines DBI/XDBI (hereinafter called the DBI line pair) interposed between the DQ line pair and the DB line pair, a first equalization circuit 2 for equalizing the voltages on the DQ line pair to a logic high level (HIGH), a second equalization circuit 3 for equalizing the voltages on the DBI line pair to a logic low level (LOW), a third equalization circuit 4 for equalizing the voltages on the DB line pair to HIGH, an NMOS cross-coupled amplifier 5 interposed between the DQ line pair and the DBI line pair so that the data on the DQ line pair are transmitted onto the DBI line pair, a PMOS latch circuit 6 disposed between the DBI line pair so that the data on the DBI line pair are held, a PMOS cross-coupled amplifier 7 interposed between the DBI line pair and the DB line pair so that the data on the DBI line pair are transmitted onto the DB line pair, a first detection circuit 8 for detecting a voltage swing (amplitude) of not less than a specified amount on the DQ line pair, a second detection circuit 9 for detecting the completion of the voltage equalization of the DBI line pair, a third detection circuit 10 for detecting the completion of the voltage equalization of the DB line pair, and an RS flip-flop 11 for generating an equalization/sensing control signal (hereinafter called the ESC signal) from the REN signal. 0 represents a ground terminal. 1 represents a power supply terminal.

The first equalization circuit 2 is formed of two PMOS transistors 12 and 13 for equalizing the voltages on the DQ line pair to HIGH. The PMOS transistors 12 and 13 each have a gate at which the ESC signal is applied. The sources of the PMOS transistors 12 and 13 are connected in common to the power supply terminal 1 and the drains thereof are connected to the DQ line pair (DQ and XDQ), respectively.

The second equalization circuit 3 is formed of two NMOS transistors 14 and 15 for equalizing the voltages on the DBI line pair to LOW. The NMOS transistors 14 and 15 each have a gate at which the ESC signal is applied. The sources of the NMOS transistors 14 and 15 are connected in common to the is ground terminal 0 and the drains thereof are connected to the DBI line pair (DBI and XDBI), respectively.

The third equalization circuit 4 is formed of two PMOS transistors 16 and 17 for equalizing the voltages on the DB line pair to HIGH. The PMOS transistors 16 and 17 each have a gate at which an inversion of the ESC signal is applied. The sources of the PMOS transistors 16 and 17 are connected in common to the power supply terminal 1 and the drains thereof are connected to the DB line pair (DB and XDB), respectively. The ESC-inverted signal is generated by an inverter 38.

The NMOS cross-coupled amplifier 5 is formed of three PMOS transistors 18–20 and two NMOS transistors 21 and 22. The PMOS transistor 18 has a gate at which the ESC signal is applied and a source connected to the power supply terminal 1. The PMOS transistors 19 and 20 have gates connected to the DQ line pair (DQ and XDQ) respectively, sources connected in common to the drain of the PMOS transistor 18, and drains connected to the DBI line pair (DBI and XDBI), respectively. The NMOS transistors 21 and 22 together form a latch circuit for pulling down a voltage on one of the DBI line pair to LOW and for holding the pulled-down voltage. More specifically, the gate of the NMOS transistor 21 is connected to the XDBI line while the gate of the NMOS transistor 22 is connected to the DBI line, the sources of the NMOS transistors 21 and 22 are connected in common to the ground terminal 0, and the drain of the NMOS transistor 21 is connected to the DBI line while the drain of the NMOS transistor 22 is connected to the XDBI line.

The PMOS latch circuit 6 is formed of three PMOS transistors 23–25. The PMOS transistor 23 has a gate at which a delay signal in phase with the ESC signal is applied and a source connected to the power supply terminal 1. The PMOS transistors 24 and 25 together form a latch circuit for pulling up a voltage on one of the DBI line pair to HIGH and for holding the pulled-up voltage. More specifically, the gate of the PMOS transistor 24 is connected to the XDBI line while the gate of the PMOS transistor 25 is connected to the DBI line, the sources of the PMOS transistors 24 and 25 are connected in common to the drain of the PMOS transistor 23, and the drain of the PMOS transistor 24 is connected to the DBI line while the drain of the PMOS transistor 25 is connected to the XDBI line. The aforesaid delay signal in phase with the ESC signal is generated by two inverters 34 and 35.

The PMOS cross-coupled amplifier 7 is formed of two PMOS transistors 26 and 27 and two NMOS transistors 28 and 29. The PMOS transistors 26 and 27 together form a latch circuit for pulling up a voltage on one of the DB line pair to HIGH and for holding the pulled-up voltage. More specifically, the gate of the PMOS transistor 26 is connected to the XDB line while the gate of the PMOS transistor 27 is connected to the DB line, the sources of the PMOS transistors 26 and 27 are connected in common to the power supply terminal 1, and the drain of the PMOS transistor 26 is connected to the DB line while the drain of the PMOS transistor 27 is connected to the XDB line. The NMOS transistors 28 and 29 together form a latch circuit for pulling down a voltage on one of the DB line pair to LOW and for holding the pulled-down voltage. More specifically, the gates of the NMOS transistors 28 and 29 are connected to the DBI line pair (DBI and XDBI) respectively, the sources thereof are connected in common to the ground terminal 0, and the drains thereof are connected to the DB line pair (DB and XDB) respectively.

The first detection circuit 8 is formed of a NAND circuit 30 that receives voltages on the DQ line pair as its inputs. The second detection circuit 9 is formed of a NOR circuit 31 that receives voltages on the DBI line pair as its inputs. The third detection circuit 10 is formed of an AND circuit comprising a NAND circuit 32 that receives voltages on the DB line pair as its inputs and an inverter 33 for inverting the output from the NAND circuit 32. The RS flip-flop 11 receives the REN signal as a set input, receives the logical product of outputs from the first to third detection circuits 8–10 as a reset input, and outputs the ESC signal. Such a logical product (i.e., a sense enable signal (hereinafter called the SEN signal)) is generated by the NAND circuit 36 and an inverter 37.

The data read operation of the above-described synchronous DRAM is now described. FIG. 3, comprised of 3A–3E, is a signal waveform diagram useful in understanding the operation of the data read amplifier 110 (i.e., the differential transmission circuit of FIG. 2) in the synchronous DRAM of FIG. 1.

In the standby state, both the REN signal and the SEN signal are at LOW. The RS flip-flop 11 provides the ESC signal of LOW. As a result, the first equalization circuit 2 is made active, whereby the DQ line pair are equalized in voltage to HIGH. Both the second equalization circuit 3 and the third equalization circuit 4 have been placed in the inactive state.

When the REN signal rises to HIGH, the RS flip-flop 11 causes the ESC signal to make a transition to HIGH in response to the REN signal of HIGH. The first equalization circuit 2 is therefore made inactive. On the other hand, both the second equalization circuit 3 and the third equalization circuit 4 are made active. As a result, the voltage equalization of the DQ line pair by the first equalization circuit 2 is interrupted and the sensing operation onto the DQ line pair starts. Meanwhile, the second equalization circuit 3 starts equalizing the voltages on the DBI line pair and the third equalization circuit 4 starts equalizing the voltages on the DB line pair. The DBI line pair voltage moves to LOW. The DB line pair voltage moves to HIGH. The completion of the voltage equalization of the DBI line pair is detected by the NOR circuit 31 forming the second detection circuit 9. The completion of the voltage equalization of the DB line pair is detected by the NAND circuit 32 and the inverter 33 together forming the third detection circuit 10. The PMOS transistor 18 in the NMOS cross-coupled amplifier 5 turns off in response to the REN signal of HIGH thereby disconnecting communication between the DQ line pair and the DBI line pair.

With the voltage equalization of the DQ line pair completed as described above, data having either a logical value of one or a logical value of zero is read from the MC/SA array 100. The data read amplifier 110 receives the data through the DQ line pair. One of the DQ line pair corresponding in value to the received data makes a voltage transition to LOW, as a result of which there is produced a difference in potential between the DQ line pair. The NAND circuit 30 forming the first detection circuit 8 detects a voltage swing on the DQ line pair. In other words, the NAND circuit 30 detects a voltage swing from HIGH to LOW on one of the DQ line pair and provides an output of HIGH to the NAND circuit 36. If at this point in time, both the voltage equalization between the DBI line pair and the voltage equalization between the DB line pair are already completed and the outputs from the second and third detection circuits 9 and 10 are already at HIGH, the SEN signal makes a transition to HIGH immediately the output from the NAND circuit 30 makes a transition to HIGH. When the SEN signal makes such a transition, the ESC signal is brought back to LOW by the RS flip-flop 11.

When the ESC signal returns to LOW as described above, both the voltage equalization of the DBI line pair by the second equalization circuit 3 and the voltage equalization of the DB line pair by the third equalization circuit 4 are interrupted. The sensing operation onto the DBI line pair and the sensing operation onto the DB line pair start. In other words, the PMOS transistor 18 turns on thereby making the NMOS cross-coupled amplifier 5 active. With a slight delay with respect to the turning-on of the PMOS transistor 18, the PMOS transistor 23 also turns on thereby making the PMOS latch circuit 6 active. At this time, by virtue of the PMOS transistors 19 and 20 there is produced a corresponding potential difference between the DBI line pair to the potential difference between DQ line pair in order that the data on the DQ line pair are transmitted onto the DBI line pair. Such a potential difference produced between the DBI line pair is detected, amplified and held by the NMOS transistors 21 and 22 in the NMOS cross-coupled amplifier 5 and the PMOS transistors 24 and 25 in the PMOS latch circuit 6. As a result, the data on the DBI line pair become definite. At the time when the voltage on one of the DBI line pair increases to go beyond the threshold voltage of the NMOS transistors 28 and 29 in the PMOS cross-coupled amplifier 7, the NMOS transistor 28 or the NMOS transistor 29, whichever undergoes an increase in the gate voltage, turns on thereby making the PMOS cross-coupled amplifier 7 active. As a result, a potential difference corresponding to the potential difference between the DBI line pair is produced between the DB line pair. In this way, the data on the DBI line pair are transmitted onto the DB line pair. The potential difference produced between the DB line pair is detected, amplified and held by the PMOS transistors 26 and 27 and the NMOS transistors 28 and 29. As a result, the data on the DB line pair become definite. The data, as transmitted onto the DB line pair, are provided outside by way of the output circuit 120, as shown in FIG. 1.

Meanwhile, the first equalization circuit 2 resumes the voltage equalization of the DQ line pair immediately the ESC signal is brought back to LOW, the reason for which is that it is no longer required to continuously perform the sensing operation onto the DQ line pair when the potential difference between the DB line pair starts growing. The NAND circuit 30 forming the first detection circuit 8 severs also as detecting the completion of the voltage equalization of the DQ line pair. In other words, when the NAND circuit 30 detects that the DQ line pair have been equalized in voltage to HIGH, the NAND circuit 30 provides an output of LOW to the NAND circuit 36. This causes the SEN signal to return to its original logic level of LOW. When the DQ line pair are equalized in voltage to HIGH, this causes both of the PMOS transistors 19 and 20 in the NMOS cross-coupled amplifier 5 to turn off. As a result, although the PMOS transistor 18 still remains in the ON state, the communication between the DQ line pair and the DBI line pair is disconnected in the NMOS cross-coupled amplifier 5. At this time, all of the NMOS transistors 21 and 22 in the NMOS cross-coupled amplifier 5, the PMOS transistors 24 and 25 in the PMOS latch circuit 6, and the PMOS transistors 26 and 27 and the NMOS transistors 28 and 29 in the PMOS cross-coupled amplifier 7 continue performing hold operations, so that both the data on the DBI line pair and the data on the DB line pair are held.

By virtue of a series of operations as described above, all of the REN signal, the SEN signal, and the ESC signal return to the standby state (i.e., LOW). A read operation of reading the next data starts by rising the REN signal again to HIGH.

If a data transmission from the DQ line pair onto the DBI line pair starts before the DBI line pair are not sufficiently equalized in voltage, this may result in the occurrence of error data on the DBI line pair. Likewise, if a data transmission from the DBI line pair onto the DB line pair starts before the DB line pair are not sufficiently equalized in voltage, this may result in the occurrence of error data on the DB line pair. In order to avoid such an unwanted event, the SEN signal is brought into HIGH by the NAND circuit 36 and the inverter 37, when the first detection circuit 8 detects a voltage swing of not less than a specified amount on the DQ line pair, the second detection circuit 9 detects the completion of the voltage equalization of the DBI line pair to LOW, and the third detection circuit 10 detects the completion of the voltage equalization of the DB line pair to HIGH.

As described above, in accordance with the data read amplifier 110 of FIG. 2, the start of the voltage equalization of the DBI and DB line pairs is triggered just by the application of the REN signal, as a result of which the ESC signal changes to HIGH (i.e., the equalizing mode) to automatically start voltage-equalizing the DBI and DB line pairs. Thereafter, the ESC signal returns to LOW (i.e., the sensing mode) to the arrival timing of data at the DQ line pair and to the completion timing of the voltage-equalization of the DBI and DB line pairs to automatically start performing the sensing operation onto the DBI and DB line pairs. In other words, it is no longer required to externally control the sensing operations within the data read amplifier 110. This eliminates the necessity of the setting of a timing margin which has conventionally been required to make.

The present invention can reduce the length of one cycle of the differential data transmission. In other words, by virtue of the data read amplifier 110 of FIG. 2, it becomes possible to continuously read a plurality of data at a higher read rate.

The present invention has been described in terms of applications to synchronous DRAMs. However, the differential transmission circuit of FIG. 2 can find applications in a variety of semiconductor integrated circuits.

What is claimed is:

1. A differential transmission circuit for transmission of data in a semiconductor integrated circuit, comprising:

a first pair of complementary signal lines;

a first equalization circuit for equalizing voltages on said first pair of complementary signal lines to a first voltage level;

a second pair of complementary signal lines;

a second equalization circuit for equalizing voltages on said second pair of complementary signal lines to a second voltage level;

means for receiving data onto said first pair of complementary signal lines;

a first detection circuit for detecting a voltage swing of not less than a specified amount on each of said first pair of complementary signal lines;

a first transmission circuit for transmitting said data on said first pair of complementary signal lines onto said second pair of complementary signal lines; and a control circuit for controlling said first equalization circuit, said second equalization circuit, and said first transmission circuit;

wherein said control circuit has the functions of:

directing said first equalization circuit to voltage-equalize said first pair of complementary signal lines in a standby state;

in response to an enable signal, directing said first equalization circuit to interrupt the voltage equalization of said first pair of complementary signal lines, directing said first transmission circuit to disconnect communication between said first pair of complementary signal lines and said second pair of complementary signal lines, and directing said second equalization circuit to start voltage-equalizing said second pair of complementary signal lines;

generating a timing signal in response to the detection of said voltage swing by said first detection circuit; and in response to said timing signal, directing said second equalization circuit to interrupt the voltage equalization of said second pair of complementary signal lines and directing said first transmission circuit to establish communication between said first pair of complementary signal lines and said second pair of complementary signal lines.

2. The differential transmission circuit according to claim 1, said first transmission circuit having:

a cross-coupled amplifier of a first conductivity type connected between said first pair of complementary signal lines and said second pair of complementary signal lines; and a latch circuit of a second conductivity type connected between said second pair of complementary signal lines.

3. The differential transmission circuit according to claim 1, said control circuit further having the function of:

directing said first equalization circuit to resume the voltage equalization of said first pair of complementary signal lines in response to said timing signal.

4. The differential transmission circuit according to claim 1, wherein:

said differential transmission circuit further comprises a second detection circuit for detecting the completion of the voltage equalization of said second pair of complementary signal lines; and said control circuit further has the function of directing said first transmission circuit to transmit said data on said first pair of complementary signal lines onto said second pair of complementary signal lines, when said first detection circuit detects said voltage swing and said second detection circuit detects the completion of the voltage equalization of said second pair of complementary signal lines.

5. The differential transmission circuit according to claim 1, said differential transmission circuit further comprising:

a third pair of complementary signal lines;

a third equalization circuit for equalizing voltages on said third pair of complementary signal lines to said first voltage level; and a second transmission circuit for transmitting said data on said second pair of complementary signal lines onto said third pair of complementary signal lines;

wherein said control circuit has the functions of:

directing said third equalization circuit to start voltage-equalizing said third pair of complementary signal lines in response to said enable signal; and directing said third equalization circuit to interrupt the voltage equalization of said third pair of complementary signal lines in response to said timing signal.

6. The differential transmission circuit according to claim 5, wherein said second transmission circuit has a cross-coupled amplifier of said second conductivity type connected between said second pair of complementary signal lines and said third pair of complementary signal lines.

7. The differential transmission circuit according to claim 5,
   said differential transmission circuit further comprising a third detection circuit for detecting the completion of the voltage equalization of said third pair of complementary signal lines;
   said control circuit further having the functions of:
      directing said first transmission circuit to transmit said data on said first pair of complementary signal lines onto said second pair of complementary signal lines and directing said second transmission circuit to transmit said data on said second pair of complementary signal lines onto said third pair of complementary signal lines, when said first detection circuit detects said voltage swing, said second detection circuit detects the completion of the voltage equalization of said second pair of complementary signal lines, and said third detection circuit detects the completion of the voltage equalization of said third pair of complementary signal lines.

8. A semiconductor memory device having a data read amplifier,
   said data read amplifier comprising:
      a pair of complementary input signal lines;
      a first equalization circuit for equalizing voltages on said pair of complementary input signal lines to a logic high level;
      a pair of complementary intermediate signal lines;
      a second equalization circuit for equalizing voltages on said pair of complementary intermediate signal lines to a logic low level;
      a pair of complementary output signal lines;
      a third equalization circuit for equalizing voltages on said pair of complementary output signal lines to the logic high level;
      means for receiving data onto said pair of complementary input signal lines;
      a first detection circuit for detecting a voltage swing of not less than a specified amount on each of said pair of complementary input signal lines;
      a second detection circuit for detecting the completion of the voltage equalization of said pair of complementary intermediate signal lines;
      a third detection circuit for detecting the completion of the voltage equalization of said pair of complementary output signal lines;
      an NMOS cross-coupled amplifier connected between said pair of complementary input signal lines and said pair of complementary intermediate signal lines for transmitting said data on said pair of complementary input signal lines onto said pair of complementary intermediate signal lines;
      a PMOS latch circuit connected between said pair of complementary intermediate signal lines for holding said data on said pair of complementary intermediate signal lines;
      a PMOS cross-coupled amplifier connected between said pair of complementary intermediate signal lines and said pair of complementary output signal lines for transmitting said data on said pair of complementary intermediate signal lines onto said pair of complementary output signal lines;
      a control circuit for controlling said first equalization circuit, said second equalization circuit, said third equalization circuit, said NMOS cross-coupled amplifier, and said PMOS latch circuit;
      wherein said control circuit has the functions of:
         directing said first equalization circuit to voltage-equalize said pair of complementary input signal lines in a standby state;
         in response to a read enable signal, directing said first equalization circuit to interrupt the voltage equalization of said pair of complementary input signal lines, directing said NMOS cross-coupled amplifier to disconnect communication between said pair of complementary input signal lines and said pair of complementary intermediate signal lines, directing said second equalization circuit to start voltage-equalizing said pair of complementary intermediate signal lines, and directing said third equalization circuit to start voltage-equalizing said pair of complementary output signal lines; and
         directing said second equalization circuit to interrupt the voltage equalization of said pair of complementary intermediate signal lines, directing said third equalization circuit to interrupt the voltage equalization of said pair of complementary output signal lines, directing said NMOS cross-coupled amplifier to transmit said data on said pair of complementary input signal lines onto said pair of complementary intermediate signal lines, directing said PMOS latch circuit to hold said data on said pair of complementary intermediate signal lines, directing said PMOS cross-coupled amplifier to transmit said data on said pair of complementary intermediate signal lines onto said pair of complementary output signal lines, and directing said first equalization circuit to resume the voltage equalization of said pair of complementary input signal lines, when said first detection circuit detects said voltage swing, said second detection circuit detects the completion of the voltage equalization of said pair of complementary intermediate signal lines, and said third detection circuit detects the completion of the voltage equalization of said pair of complementary output signal lines.

9. The semiconductor memory device according to claim 8,
   said first detection circuit having a NAND circuit that receives, as inputs, voltages on said pair of complementary input signal lines;
   said second detection circuit having a NOR circuit that receives, as inputs, voltages on said pair of complementary intermediate signal lines; and
   said third detection circuit having an AND circuit that receives, as inputs, voltages on said pair of complementary output signal lines.

10. The semiconductor memory device according to claim 9, wherein said control circuit has an RS flip-flop which receives said read enable signal and the logical product of outputs from said first to third detection circuits as a first input and as a second input, respectively.

11. A differential transmission method for transmission of data in a semiconductor integrated circuit, said method comprising the steps of:
   receiving data onto a pair of complementary input signal lines which have been equalized in voltage;
   generating a timing signal upon detecting a voltage swing of not less than a specified amount of each of said pair of complementary input signal lines; and
   transmitting data on said pair of complementary input signal lines onto a pair of complementary output signal lines in response to said timing signal.

12. A differential transmission method for transmission of data in a semiconductor integrated circuit, said method comprising the steps of:

equalizing voltages on a pair of complementary input signal lines;

interrupting the voltage equalization of said pair of complementary input signal lines while starting equalizing voltages on a pair of complementary output signal lines;

receiving data onto said pair of complementary input signal lines while continuously performing the voltage equalization of said pair of complementary output signal lines;

generating a timing signal upon detecting a voltage swing of not less than a specified amount on each of said pair of complementary input signal lines; and interrupting the voltage equalization of said pair of complementary output signal lines while establishing communication between said pair of complementary input signal lines and said pair of complementary output signal lines in response to said timing signal.

13. The differential transmission method according to claim 12 further comprising the step of:

resuming the voltage equalization of said pair of complementary input signal lines in response to said timing signal.

14. The differential transmission method according to claim 12 further comprising the steps of:

detecting the completion of the voltage equalization of said pair of complementary output signal lines; and transmitting said data on said pair of complementary input signal lines onto said pair of complementary output signal lines when said voltage swing is detected and the completion of the voltage equalization of said pair of complementary output signal lines is detected.

* * * * *